United States Patent
Zhu et al.

(10) Patent No.: US 12,224,287 B2
(45) Date of Patent: Feb. 11, 2025

(54) DISPLAY SUBSTRATE AND METHOD FOR MANUFACTURING THE SAME, AND DISPLAY DEVICE

(71) Applicant: BOE Technology Group Co., Ltd., Beijing (CN)

(72) Inventors: Xiaoyan Zhu, Beijing (CN); Chuanxiang Xu, Beijing (CN); Ling Li, Beijing (CN); Hua Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 569 days.

(21) Appl. No.: 17/614,662

(22) PCT Filed: Feb. 19, 2021

(86) PCT No.: PCT/CN2021/076866
§ 371 (c)(1),
(2) Date: Nov. 29, 2021

(87) PCT Pub. No.: WO2022/174390
PCT Pub. Date: Aug. 25, 2022

(65) Prior Publication Data
US 2023/0163135 A1    May 25, 2023

(51) Int. Cl.
*H01L 21/683* (2006.01)
*H01L 27/12* (2006.01)

(52) U.S. Cl.
CPC ...... *H01L 27/1218* (2013.01); *H01L 21/6835* (2013.01); *H01L 27/1266* (2013.01); *H01L 2221/6835* (2013.01)

(58) Field of Classification Search
CPC ............ H01L 27/1218; H01L 21/6835; H01L 27/1266; H01L 2221/6835;
(Continued)

(56) References Cited

U.S. PATENT DOCUMENTS 11,800,782 B2 * 10/2023 Zhang .................... H10K 71/00
2014/0225090 A1   8/2014 Lee et al.
(Continued)

FOREIGN PATENT DOCUMENTS

CN    107946341 A    4/2018
CN    110034249 A    7/2019
(Continued)

OTHER PUBLICATIONS

International Search Report dated Oct. 27, 2021, issued in counterpart Application No. PCT/CN2021/076866. (4 pages).

*Primary Examiner* — Vu A Vu
(74) *Attorney, Agent, or Firm* — WHDA, LLP

(57) ABSTRACT

A display substrate includes a first display region and a second display region. The display substrate may include: a first base substrate; a second base substrate; a first barrier layer and a light emitting unit. The first base substrate includes a first through region penetrating the first base substrate, and the first barrier layer includes a second through region penetrating the first barrier layer. The second base substrate includes a first substrate sub-portion located in the first display region, the first substrate sub-portion penetrates the second through region, and at least a portion of the first substrate sub-portion is located in the first through region. The display substrate includes a recessed portion. The second base substrate includes a first surface located in the first display region and a second surface located in the second display region, and the first surface and the second surface are formed as a flat surface.

18 Claims, 12 Drawing Sheets

(58) Field of Classification Search
CPC ........... H01L 2221/68345; H01L 2221/68359; H10K 59/00; H10K 71/00
USPC .......................................................... 257/88
See application file for complete search history.

(56) References Cited

U.S. PATENT DOCUMENTS

| | | |
|---|---|---|
| 2019/0377445 A1 | 12/2019 | Jeong et al. |
| 2021/0359233 A1 | 11/2021 | Jang |
| 2022/0271257 A1* | 8/2022 | Won ....................... H10K 50/86 |

FOREIGN PATENT DOCUMENTS

| | | |
|---|---|---|
| CN | 110233167 A | 9/2019 |
| CN | 111211156 A | 5/2020 |
| CN | 111244142 A | 6/2020 |
| CN | 111384137 A | 7/2020 |

* cited by examiner

DISPLAY SUBSTRATE AND METHOD FOR MANUFACTURING THE SAME, AND DISPLAY DEVICE

CROSS REFERENCE

The application is a Section 371 National Stage Application of International Application No. PCT/CN2021/076866 filed on Feb. 19, 2021, entitled "DISPLAY SUBSTRATE AND METHOD FOR MANUFACTURING THE SAME, AND DISPLAY DEVICE", the content of which is incorporated herein in entirety.

TECHNICAL FIELD

The present disclosure relates to a field of display technology, and in particular to a display substrate, a method for manufacturing a display substrate, and a display device.

BACKGROUND

With an increase of users' demand for diversified use of display devices and an emergence of design requirements for a high screen-to-body ratio of display devices, a design of a full screen has become a current mainstream design. However, the full screen of a mobile phone has always been restricted by a camera. Although the market has launched perforating, pop-up and other solutions to improve the screen-to-body ratio, these solutions have problems of a poor mechanical sealing and a low perforating screen-to-body ratio. In contrast, a camera-under-screen technology may greatly increase the screen-to-body ratio of a display without affecting an overall appearance of the display. At present, in a solution of the camera-under-screen technology, how to ensure a light transmittance and a display effect at a position corresponding to an imaging module in a display substrate has become an important topic concerned by R&D personnel.

The above information disclosed in this section is only for the understanding of the background of the technical concept of the present disclosure. Therefore, the above information may contain information that does not constitute the related art.

SUMMARY

In one aspect, a display substrate is provided, including a first display region and a second display region, wherein the display substrate includes: a first base substrate; a second base substrate located on a side of the first base substrate; a first barrier layer between the first base substrate and the second base substrate; and a light emitting unit on a side of the second base substrate away from the first base substrate, wherein the first base substrate includes a first through region penetrating the first base substrate, and an orthographic projection of the first through region on the first base substrate is located in an orthographic projection of the first display region on the first base substrate; wherein the first barrier layer includes a second through region penetrating the first barrier layer, and an orthographic projection of the second through region on the first base substrate coincides with the orthographic projection of the first through region on the first base substrate; wherein the second base substrate includes a first substrate sub-portion located in the first display region, the first substrate sub-portion penetrates the second through region, and at least a part of the first substrate sub-portion is located in the first through region, the display substrate includes a recessed portion, and an orthographic projection of the recessed portion on the first base substrate coincides with the orthographic projection of the first through region on the first base substrate; and wherein the second base substrate includes a first surface and a second surface that are located on a side away from the first base substrate, the first surface is located in the first display region, the second surface is located in the second display region, and the first surface and the second surface are formed as a flat surface.

According to some exemplary embodiments, at least one light emitting unit is arranged in the first display region.

According to some exemplary embodiments, the second base substrate includes a second substrate sub-portion located in the second display region, and a thickness of the first substrate sub-portion is greater than a thickness of the second substrate sub-portion by about 0.5 micron to 2 microns.

According to some exemplary embodiments, a depth of the recessed portion is less than a thickness of the first base substrate by about 0.5 micron to 2 microns.

According to some exemplary embodiments, the first base substrate and the second base substrate contain a material of polyimide.

According to some exemplary embodiments, a thickness of the first base substrate is about 3 microns to 8 microns; and/or wherein a thickness of the second base substrate is about 3 microns to 5 microns; and/or wherein the thickness of the first base substrate is greater than the thickness of the second base substrate by about 1 micron to 5 microns.

According to some exemplary embodiments, a depth of the recessed portion is about 75%~95% of a thickness of the first base substrate; and/or wherein at least one sidewall of the recessed portion has a slope angle within a range of about 40° to 80°.

According to some exemplary embodiments, an orthographic projection of the recessed portion on the first base substrate has an area substantially equal to an area of the first display region; and/or wherein the area of the orthographic projection of the recessed portion on the first base substrate is about 0.1%~30% of an area of a combination of the first display region and the second display region.

According to some exemplary embodiments, a plurality of light emitting units are provided in the second display region, and a distribution density of the light emitting units in the first display region is less than a distribution density of the light emitting units in the second display region.

In another aspect, a display device is provided, including an image sensor and the display substrate described above, wherein an orthographic projection of the image sensor on the first base substrate is located in the first display region.

In yet another aspect, a method for manufacturing a display substrate is provided, including: forming a reinforcement layer in a first region of a glass back plate; forming a first substrate material layer on the glass back plate, wherein the first substrate material layer covers the reinforcement layer; forming a first barrier material layer on a side of the first substrate material layer away from the glass back plate; removing a part of the first barrier material layer and a part of the first substrate material layer that are located in the first region by a patterning process so as to form a first base substrate and a first barrier layer, and to expose a surface of the reinforcement layer away from the glass back plate; forming a second substrate material layer on a side of the first barrier layer away from the glass back plate so as to form a second base substrate, wherein a part of the second base substrate in the first region is in contact with the reinforcement layer, and a surface of the second base substrate away from the first base substrate is a flat surface; and separating both the glass back plate and the reinforcement layer from the first base substrate and the second base substrate so as to form a recessed portion in the first region, wherein a first adhesion force is formed between the reinforcement layer and the glass back plate, a second adhesion force is formed between the reinforcement layer and the second base substrate, and the first adhesion force is greater than the second adhesion force.

According to some exemplary embodiments, the forming a reinforcement layer includes: forming a first metal layer in the first region of the glass back plate; forming a retaining wall in a second region of the glass back plate, so that the retaining wall and the first metal layer form the recessed portion in the first region; forming, in the first region, a second metal layer on a side of the first metal layer away from the glass back plate, so that the second metal layer fills the recessed portion; and removing the retaining wall.

According to some exemplary embodiments, the forming a reinforcement layer further includes: forming a third metal layer on a side of the second metal layer away from the glass back plate.

According to some exemplary embodiments, the first metal layer is formed by a magnetron sputtering process.

According to some exemplary embodiments, the second metal layer is formed by an electroplating process.

According to some exemplary embodiments, the third metal layer is formed by a patterning process.

According to some exemplary embodiments, the first metal layer and the second metal layer contain a same material, and the third metal layer contains a material different from the material of the first metal layer.

According to some exemplary embodiments, the first metal layer contains a material of copper.

According to some exemplary embodiments, the third metal layer includes a single-layer structure containing molybdenum; or wherein the third metal layer includes a stacked-layer structure including a first sub-layer, a third sub-layer, and a second sub-layer sandwiched between the first sub-layer and the third sub-layer, the first sub-layer and the third sub-layer contain a same material, the first sub-layer contains molybdenum-niobium-titanium alloy or titanium, and the second sub-layer contains copper or aluminum.

According to some exemplary embodiments, the removing a part of the first barrier material layer and a portion of the first substrate material layer that are located in the first region by a patterning process includes: removing the part of the first barrier material layer located in the first region by a patterning process, so as to form the first barrier layer; and removing the part of the first substrate material layer located in the first region by a patterning process by using the first barrier layer as a mask.

According to some exemplary embodiments, the separating both the glass back plate and the reinforcement layer from the first base substrate and the second base substrate includes: separating both the glass back plate and the reinforcement layer from the first base substrate and the second base substrate by a laser peeling process.

According to some exemplary embodiments, the first metal layer has a thickness of 0.2 micron to 0.6 microns; and/or the second metal layer has a thickness of about 2.4 microns to 6.8 microns; and/or the third metal layer has a thickness of about 1000 angstroms to 10000 angstroms.

According to some exemplary embodiments, a thickness of the retaining wall is substantially equal to a thickness of the reinforcement layer; and/or wherein each of the thickness of the retaining wall and the thickness of the reinforcement layer is set to about 2 microns to 7 microns.

BRIEF DESCRIPTION OF THE DRAWINGS

By describing in detail exemplary embodiments of the present disclosure with reference to the drawings, the features and advantages of the present disclosure will become more apparent.

DETAILED DESCRIPTION OF EMBODIMENTS

Figure 1:
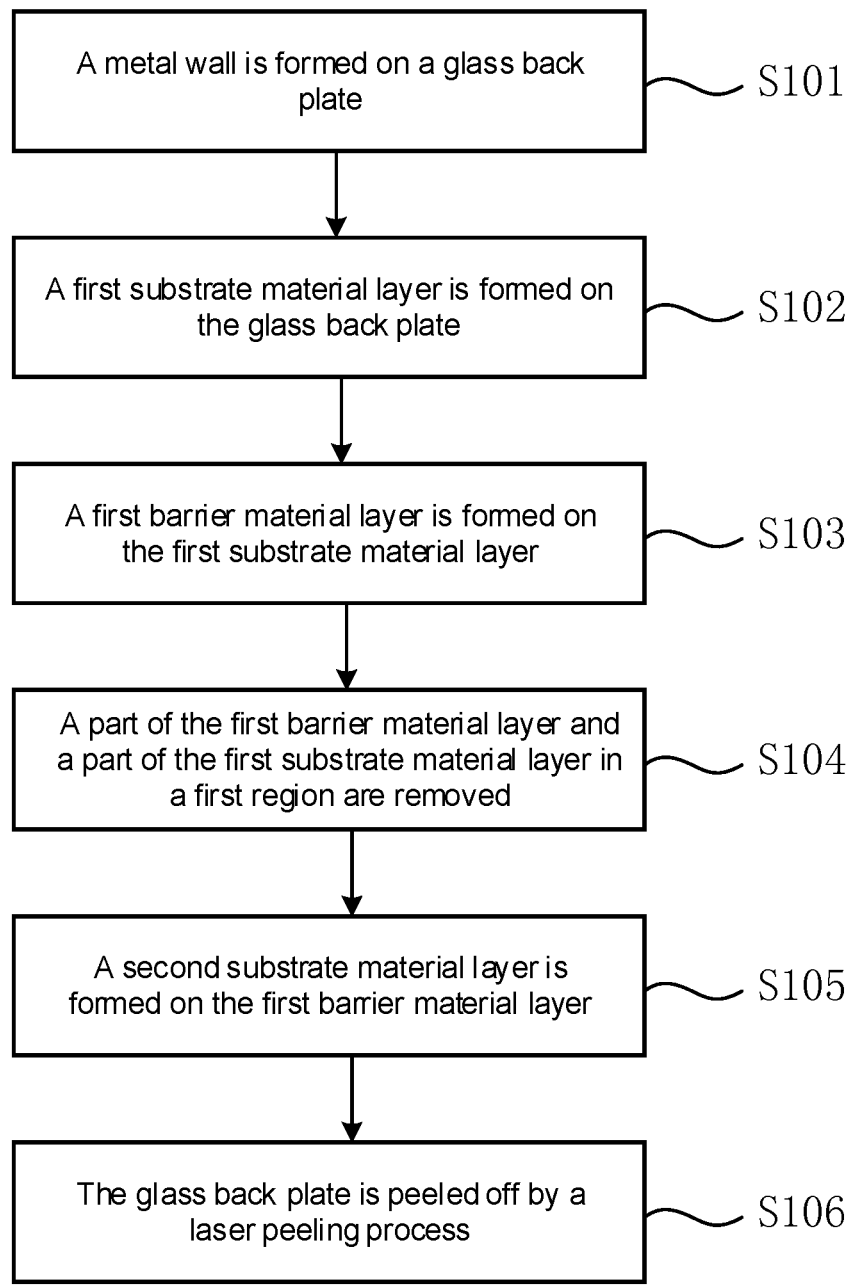
FIG. 1 is a flowchart of a method for manufacturing a display substrate according to the exemplary embodiments of the present disclosure.

In order to make objectives, technical solutions and advantages of the present disclosure more apparent, technical solutions of the embodiments of the present disclosure are clearly and completely described below with reference to the drawings. Obviously, the described embodiments are only a part but not all of the embodiments of the present disclosure. Based on the described embodiments of the present disclosure, all other embodiments obtained by those ordinary skilled in the art without creative work fall within the protection scope of the present disclosure.

It should be noted that, in the drawings, for clarity and/or description purposes, sizes and relative sizes of elements may be enlarged. Accordingly, the size and the relative size of each element are not necessarily to be limited to the size and the relative size shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group including X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It should be noted that, although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teaching of the present disclosure.

For ease of description, spatial relationship terms, such as "upper", "lower", "left", "right", may be used herein to describe the relationship between one element or feature and another element or feature as shown in the drawing. It should be understood that, the spatial relationship terms are intended to cover other different orientations of the device in use or operation in addition to the orientation described in the drawing. For example, if the device in the drawing is turned upside down, an element or feature described as "below" or "under" another element or feature will be oriented "above" or "on" the another element or feature.

It should be noted that here, the expression "flat surface" may mean that there is no obvious protrusion or depression on the surface, and "no obvious protrusion or depression" here means that except for fluctuations caused by a manufacturing process, heights of the surface at various positions do not have a difference outside a process error range.

Here, the expression "distribution density of light emitting units" refers to the number of light emitting units per unit area. Similarly, the expression "distribution density" refers to the number of components (such as repeating units, sub-pixels, light emitting units, etc.) per unit area.

Figure 2:
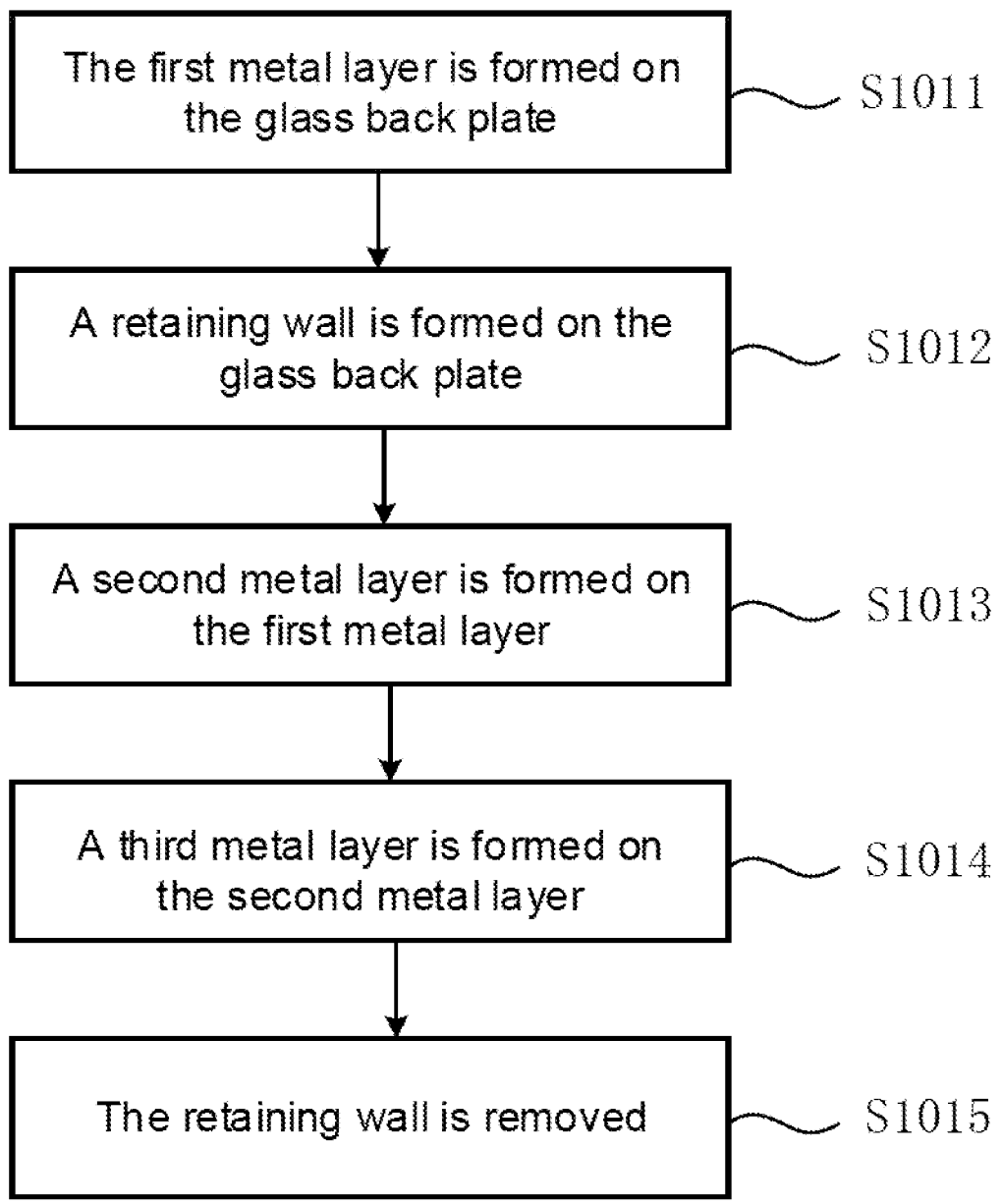
FIG. 2 is a flowchart of a method for manufacturing a reinforcement layer of a display substrate according to the exemplary embodiments of the present disclosure.

FIG. 1 schematically shows a flowchart of a method for manufacturing a display substrate according to an embodiment of the present disclosure. FIG. 2 is a flowchart of a method for manufacturing a reinforcement layer of a display substrate according to an exemplary embodiment of the present disclosure. FIG. 3 to FIG. 12A show cross-sectional views of a structure after main steps of the method for manufacturing the display substrate according to an embodiment of the present disclosure are performed. Hereinafter, an exemplary method for manufacturing a display substrate according to the present disclosure will be described in detail with reference to FIG. 1 to FIG. 12A.

In step S101, referring to FIG. 1 to FIG. 6, a reinforcement layer 12 is formed in a first region A1 on a glass back plate 11. Specifically, referring to FIG. 6, the reinforcement layer 12 may include three metal layers. A first metal layer 121 and a second metal layer 122 may contain a same metal material such as copper. A third metal layer 123 may contain a material different from the material of the first metal layer 121. For example, the third metal layer 123 may contain molybdenum.

The third metal layer 123 includes a single-layer structure, for example, a single-layer structure containing only molybdenum.

Optionally, the third metal layer 123 is configured as a staked-layer structure including three sub-layers, for example, including a first sub-layer, a third sub-layer, and a second sub-layer sandwiched between the first sub-layer and the third sub-layer. The first sub-layer and the third sub-layer may contain a same material. For example, the first sub-layer may contain molybdenum-niobium-titanium alloy or titanium, and the second sub-layer may contain copper or aluminum.

In step S101, steps of forming the reinforcement layer 12 may specifically include following steps.

Figure 3:
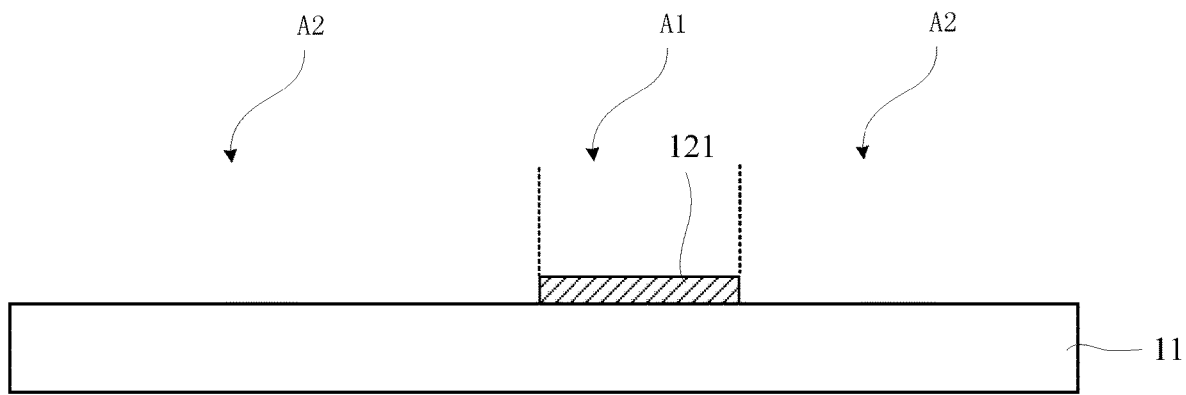
FIG. 3 is a cross-sectional view of a display substrate in step S1011 according to the exemplary embodiments of the present disclosure.

In step S1011, as shown in FIG. 3, the first metal layer 121 is formed in the first region A1 of the glass back plate 11.

For example, the first metal layer 121 may be formed by a magnetron sputtering process, and a thickness of the first metal layer 121 may be controlled to be about 0.2 micron to 0.6 micron. Forming the first metal layer 121 by the magnetron sputtering process may provide a good adhesion force between the first metal layer 121 and the glass back plate 11.

Figure 4:
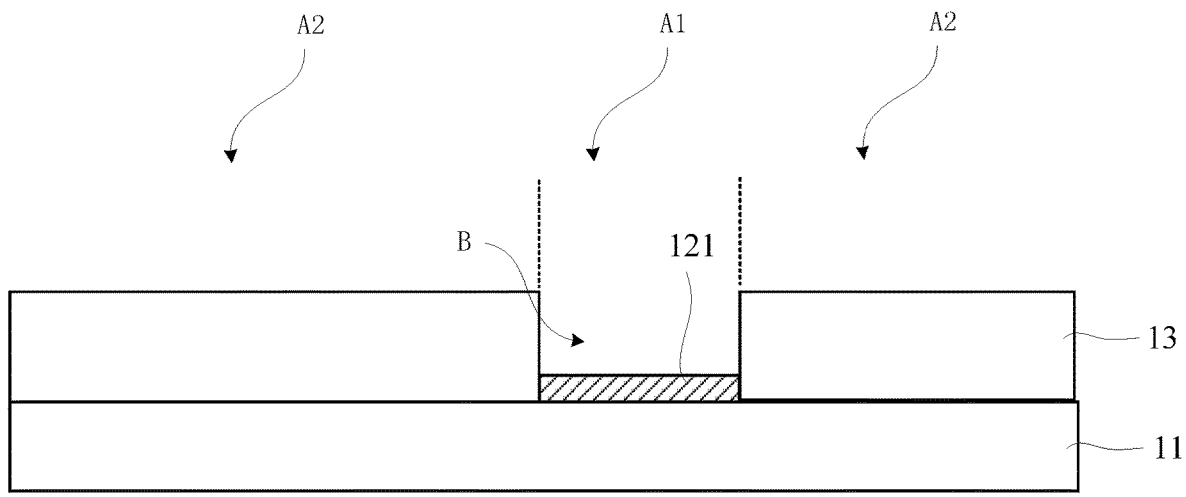
FIG. 4 is a cross-sectional view of a display substrate in step S1012 according to the exemplary embodiments of the present disclosure.

In step S1012, as shown in FIG. 4, a retaining wall 13 is formed in a second region A2 of the glass back plate 11, so that the retaining wall 13 and the first metal layer 121 form a recessed portion B located in the first region.

For example, the retaining wall may contain a covering layer material, and the retaining wall is formed only in the second region, which is convenient for an execution of step S1013.

For example, the retaining wall 13 may have a thickness substantially equal to a thickness of the reinforcement layer to be formed. The thickness of the retaining wall 13 is set to be about 2 microns to 7 microns.

Figure 5:
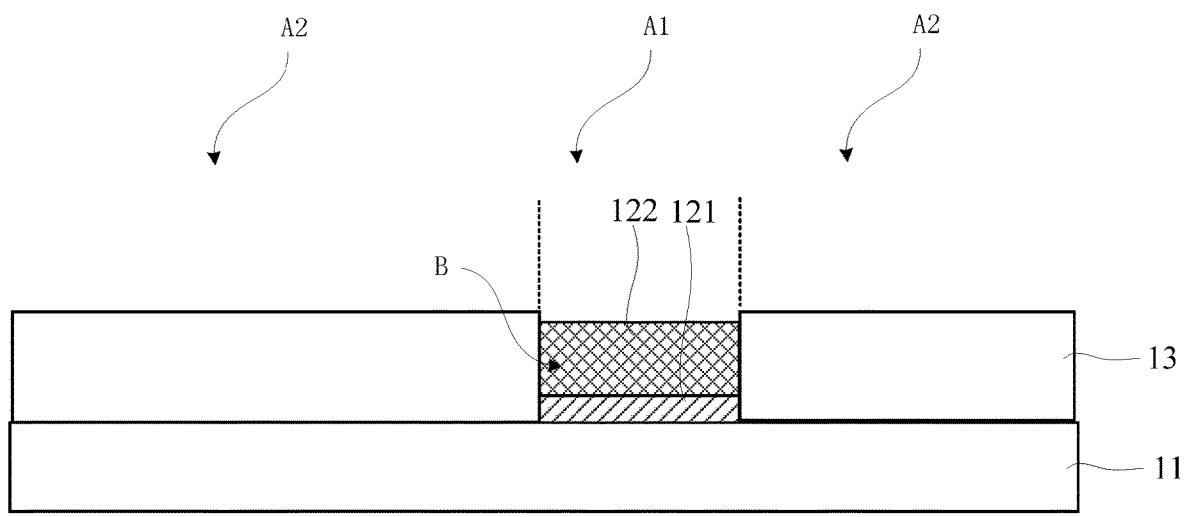
FIG. 5 is a cross-sectional view of a display substrate in step S1013 according to the exemplary embodiments of the present disclosure.

In step S1013, as shown in FIG. 5, in the first region A1, the second metal layer 122 is formed on a side of the first metal layer 121 away from the glass back plate 11, so that the second metal layer fills the recessed portion B.

For example, the second metal layer 122 may be formed by an electroplating process, and a thickness of the second metal layer 122 may be controlled to be about 2.4 microns to 6.8 microns. Compared with the magnetron sputtering process of forming the first metal layer 121, the second metal layer 122 may be formed with a greater thickness. In addition, on the basis of step S1012, the second region A2 is shielded by the retaining wall. Therefore, in a process of performing step S1013, the second metal layer 122 is formed only in the recessed portion B, so as to ensure a more regular size of the second metal layer 122.

Figure 6:
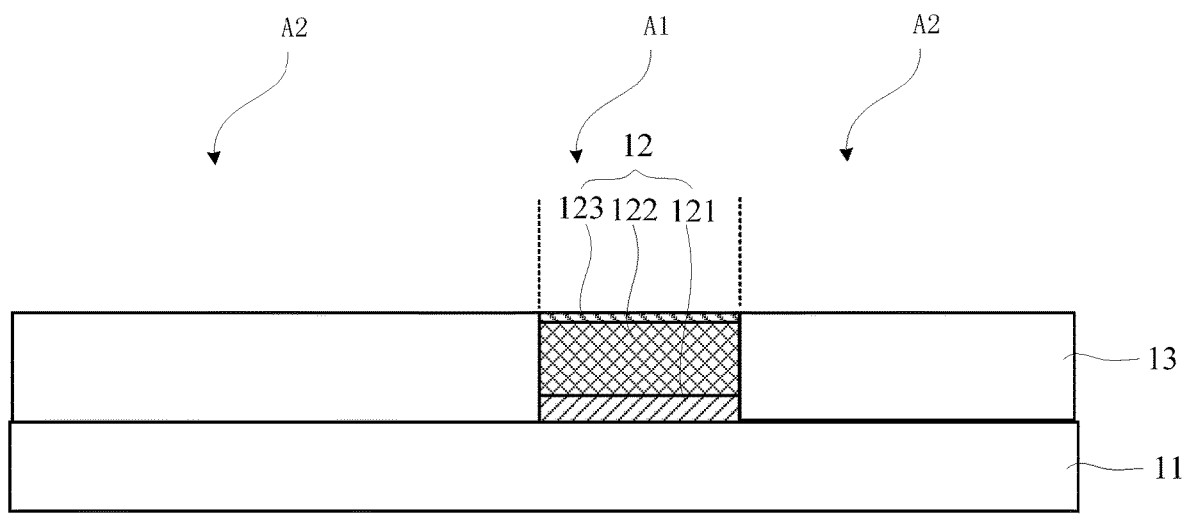
FIG. 6 is a cross-sectional view of a display substrate in step S1014 according to the exemplary embodiments of the present disclosure.

In step S1014, as shown in FIG. 6, the third metal layer 123 is formed on a side of the second metal layer 122 away from the glass back plate 11. Specifically, after the second metal layer 122 is formed, the third metal layer 123 is continuously formed on the second metal layer 122. For example, the third metal layer 123 may be formed by a patterning process, and a thickness of the third metal layer may be set to about 1000 angstroms to 10000 angstroms. Specifically, the third metal layer 123 is formed (by specific steps of a patterning process) so that a thickness of the reinforcement layer including the first metal layer, the second metal layer and the third metal layer is equal to a depth of the recessed portion B formed in step S1013, so as to achieve a precise control of the thickness of the reinforcement layer 12. For example, the thickness of the reinforcement layer may be set to about 2 microns to 7 microns. Here, the reinforcement layer may be, for example, a metal wall.

Figure 7:
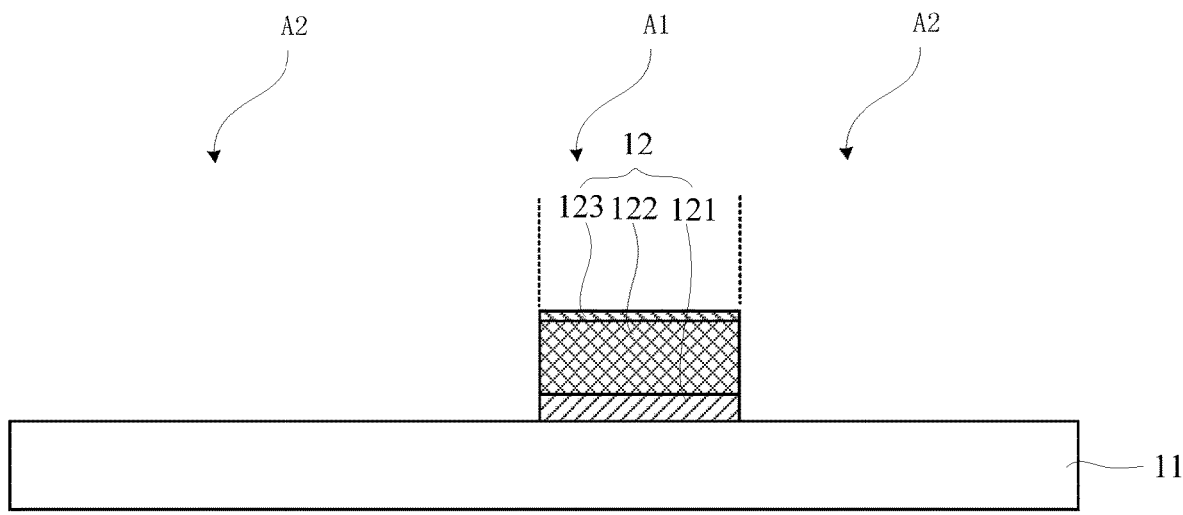
FIG. 7 is a cross-sectional view of a display substrate in step S1015 according to the exemplary embodiments of the present disclosure.

In step S1015, as shown in FIG. 7, the retaining wall 13 is removed.

For example, the retaining wall 13 may be removed by a dry engraving process, that is, the reinforcement layer 12 is formed only in the first region A1 of the glass back plate, and the retaining wall 13 in the second region A2 of the glass back plate is removed.

Figure 8:
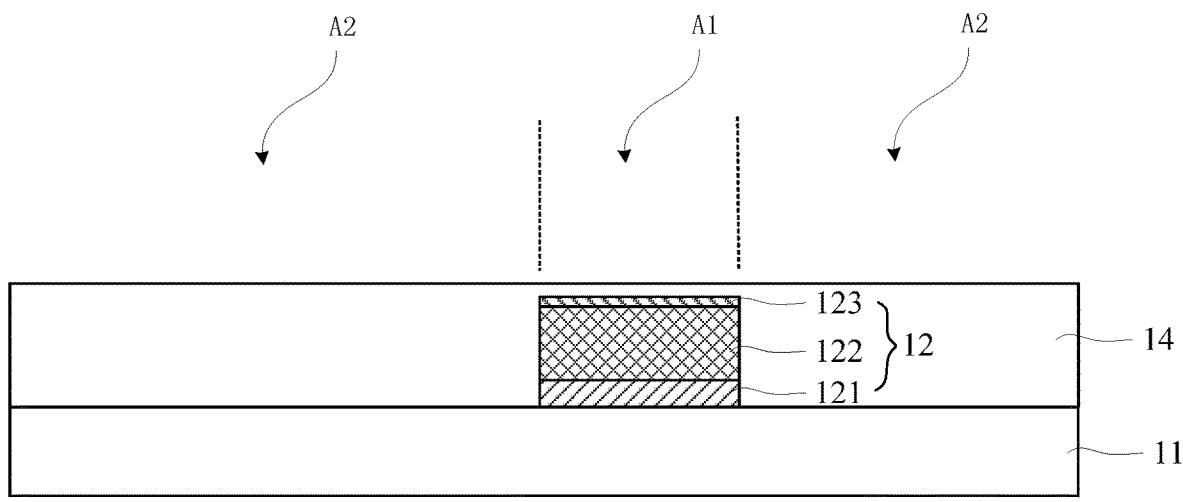
FIG. 8 is a cross-sectional view of a display substrate in step S102 according to the exemplary embodiments of the present disclosure.

In step S102, referring to FIG. 8, a first substrate material layer 14 is formed on the glass back plate 11, so that the first substrate material layer 14 covers the reinforcement layer 12. Specifically, the first substrate material may contain, for example, polyimide. A thickness of the first substrate material formed on the glass back plate 11 may be greater than the thickness of the reinforcement layer 12 formed on the glass back plate by about 0.5 micron to 2 microns, for example, about 1 micron. For example, the thickness of the first substrate material may be about 3 microns to 8 microns.

Figure 9:
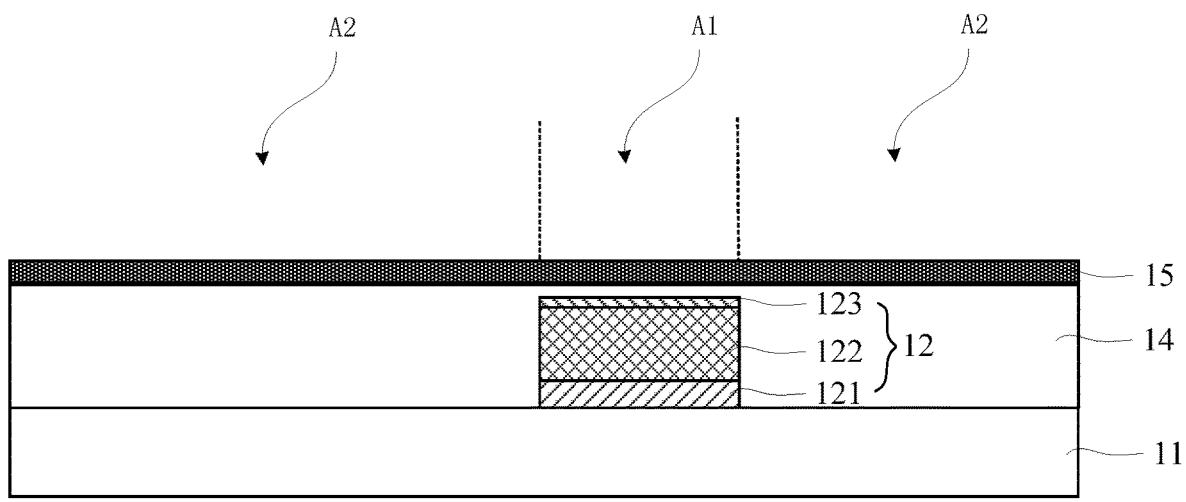
FIG. 9 is a cross-sectional view of a display substrate in step S103 according to the exemplary embodiments of the present disclosure.

In step S103, referring to FIG. 9, a first barrier material layer 15 is formed on a side of the first substrate material layer 14 away from the glass back plate 11. Specifically, after the first substrate material layer 14 is formed, the first barrier material layer 15 is deposited by a deposition process. The first barrier material layer 15 may contain, for example, an inorganic material.

Figure 10:
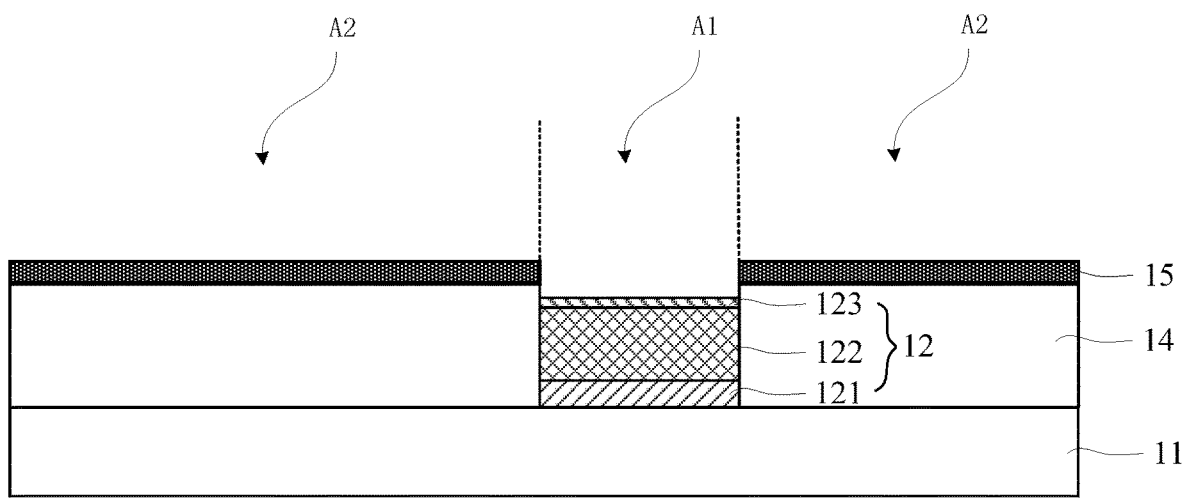
FIG. 10 is a cross-sectional view of a display substrate in step S104 according to the exemplary embodiments of the present disclosure.

In step S104, referring to FIG. 10, a part of the first barrier material layer 15 and a part of the first substrate material layer 14 located in the first region A1 are removed by a patterning process, so as to form a first base substrate 14 and a first barrier layer 15, and expose a surface of the reinforcement layer 12 away from the glass back plate 11.

For example, the part of the first barrier material layer located in the first region A1 is removed by a patterning process, so as to form the first barrier layer 15; and the part of the first substrate material layer located in the first region is removed by a patterning process by using the first barrier layer 15 as a mask.

For example, by removing the first barrier material in the first region by exposure, development and etching, a breakage of the first barrier material layer during a peeling process may be effectively prevented. After the first barrier material layer is removed, by removing the first substrate material on the reinforcement layer in the first region by a patterning process, the first substrate material may be removed without damaging the reinforcement layer.

Figure 11:
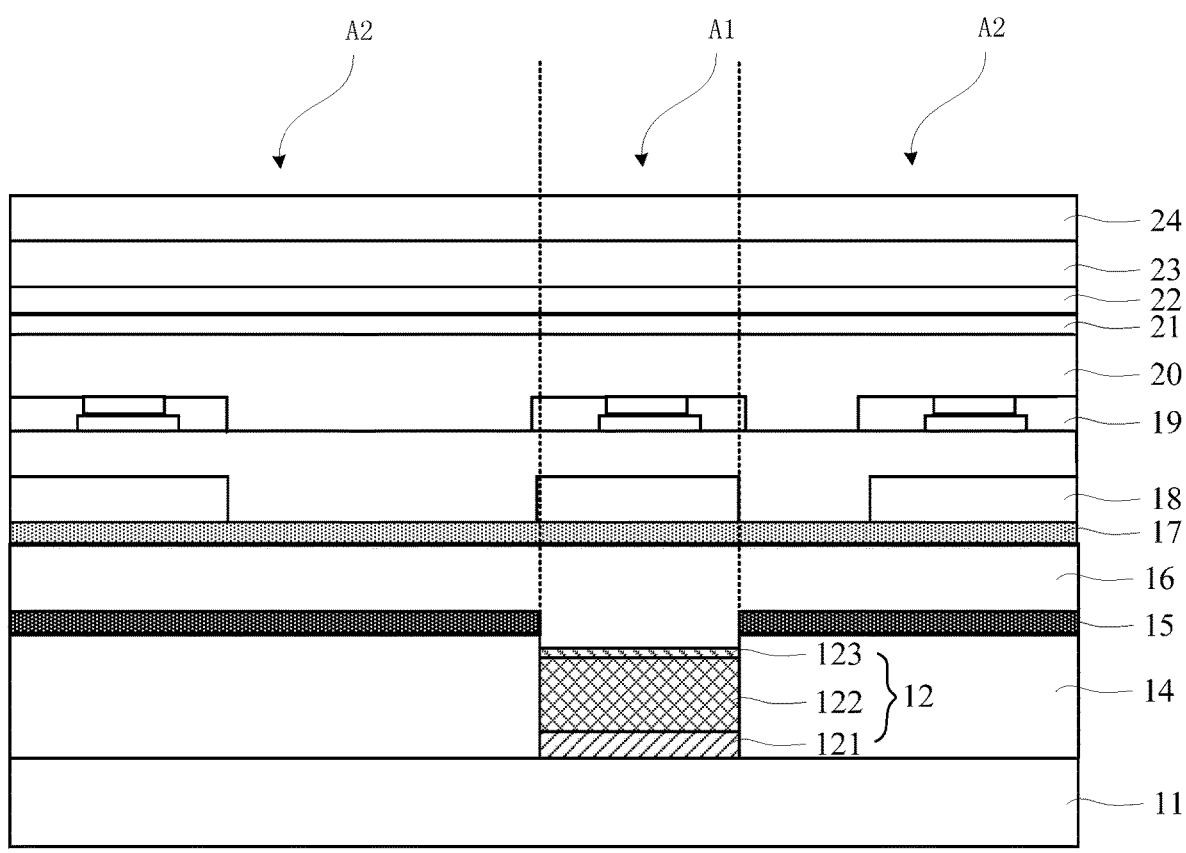
FIG. 11 is a cross-sectional view of a display substrate in step S105 according to the exemplary embodiments of the present disclosure.

In step S105, referring to FIG. 11, a second substrate material layer is formed on a side of the first barrier layer 15 away from the glass back plate 11, so as to form a second base substrate 16. A part of the second base substrate 16 in the first region is in contact with the reinforcement layer 12. A surface of the second base substrate 16 away from the first base substrate 14 is a flat surface. In the embodiments of the present disclosure, other structures of the display substrate, for example, a second barrier layer 17, a thin film transistor 18 (for example, including an active layer, a gate electrode, a source electrode, a drain electrode and other structures), a light emitting unit 19, a TFE layer (that is, thin film encapsulation structure) 20, a touch layer 21, a COE layer (that is, color on encapsulation layer) 22, an OCA layer (that is, optically clear adhesive layer) 23, a cover plate 24, etc., are further formed on the surface of the second base substrate 16.

For example, the part of the second base substrate 16 in the first region A1 is in contact with the reinforcement layer 12 to compensate for an insufficient strength of the first base substrate 14 due to a removal of the part of the first base substrate 14 in the first region A1. By setting the surface of the second base substrate 16 away from the first base substrate 14 to a flat plane, an active layer of a thin film transistor (TFT) subsequently formed on the second base substrate 16 may be formed as a flat film layer. In this way, it is advantageous for a uniform crystallization when the active layer of the TFT is crystallized. Therefore, in the embodiments of the present disclosure, a light transmittance of the display substrate may be further improved without affecting electrical characteristics of a driving circuit of the display substrate.

Figure 12A:
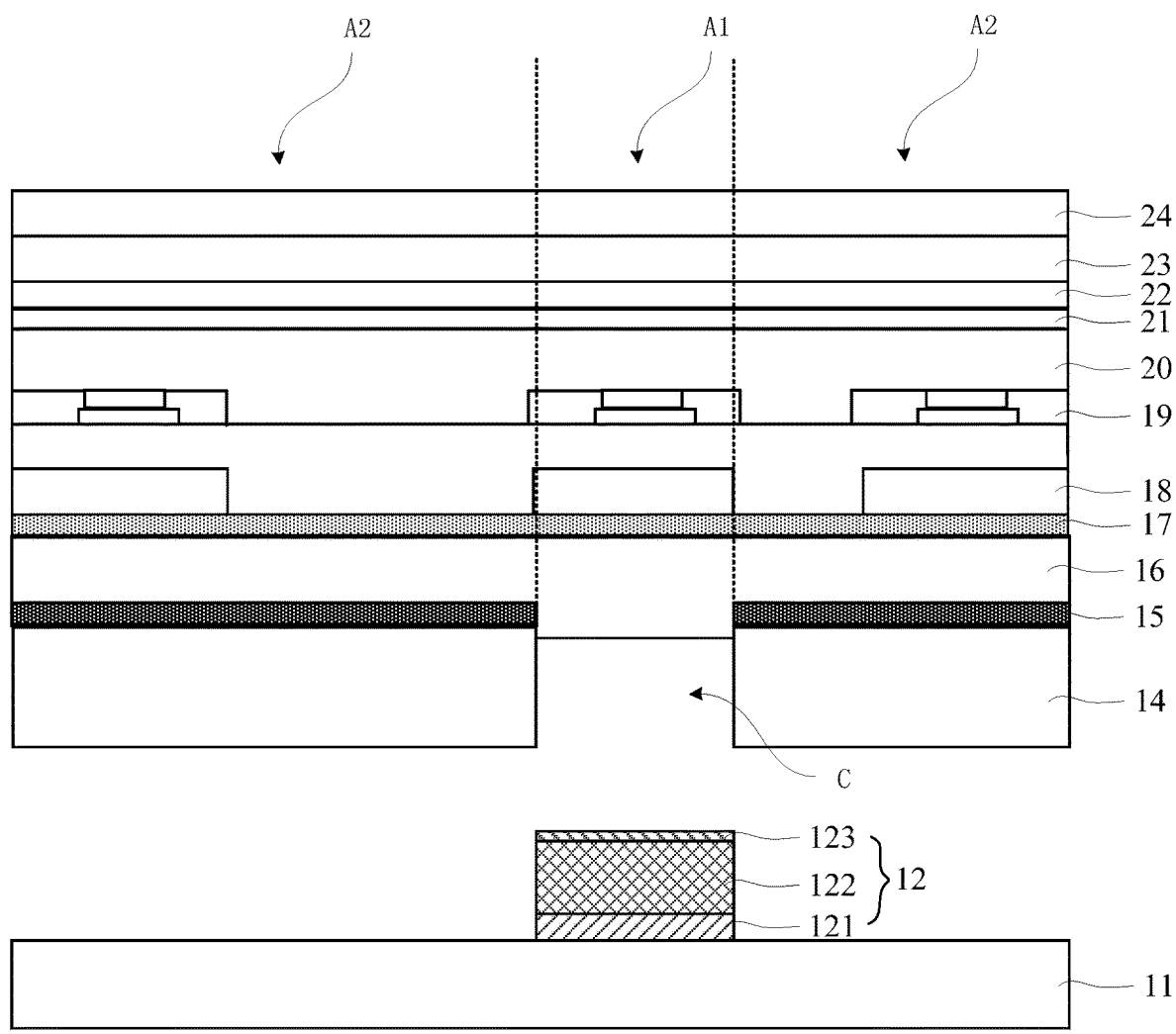
FIG. 12A is a cross-sectional view of a display substrate in step S106 according to the exemplary embodiments of the present disclosure.

In step S106, referring to FIG. 12A, the glass back plate 11 and the reinforcement layer 12 are separated from the first base substrate 14 and the second base substrate 16, so as to form a recessed portion C in the first region A1.

For example, the glass back plate 11 and the reinforcement layer 12 may be separated from the first base substrate 14 and the second base substrate 16 by a laser peeling process.

According to the embodiments of the present disclosure, a first adhesion force is formed between the reinforcement layer 12 and the glass back plate 11, and a second adhesion force is formed between the reinforcement layer 12 and the second base substrate 16. The first adhesion force is greater than the second adhesion force. Therefore, when the glass back plate 11 and the reinforcement layer 12 are separated from the first base substrate 14 and the second base substrate 16, the reinforcement layer 12 may not be detached from the glass back plate 11 because the first adhesion force between the reinforcement layer 12 and the glass back plate 11 is relatively larger. Further, because the second adhesive force between the reinforcement layer 12 and the second base substrate 16 is less than the first adhesive force, the second base substrate 16 may be detached from the reinforcement layer 12 in preference to the glass back plate 11, so as to ensure a formation of the recessed portion C. After the recessed portion C is formed, due to a sum of the thickness of the first base substrate 14 and the thickness of the second base substrate 16 is reduced, the display substrate exhibits a good light transmittance in the first region, which is beneficial to improve a quality of an image received by an image sensor arranged in an orthographic projection range of the first region.

For example, when the reinforcement layer 12 is peeled from the first base substrate 14 and the second base substrate 16, a surface of the first base substrate 14 and a surface of the second base substrate 16 in contact with the reinforcement 12 (for example, a side surface of the first base substrate 14 facing the recessed portion C, a lower surface of the second base substrate 16 facing the recessed portion C) may change. For example, some metal particles may remain on at least one of the side surface of the first base substrate 14 facing the recessed portion C and the lower surface of the second base substrate 16 facing the recessed portion C. Accordingly, the at least one of the side surface of the first base substrate 14 facing the recessed portion C and the lower surface of the second base substrate 16 facing the recessed portion C may have different surface properties from the surface property of the other surfaces of the first base substrate 14 or the other surfaces of the second base substrate 16.

Figure 12B:
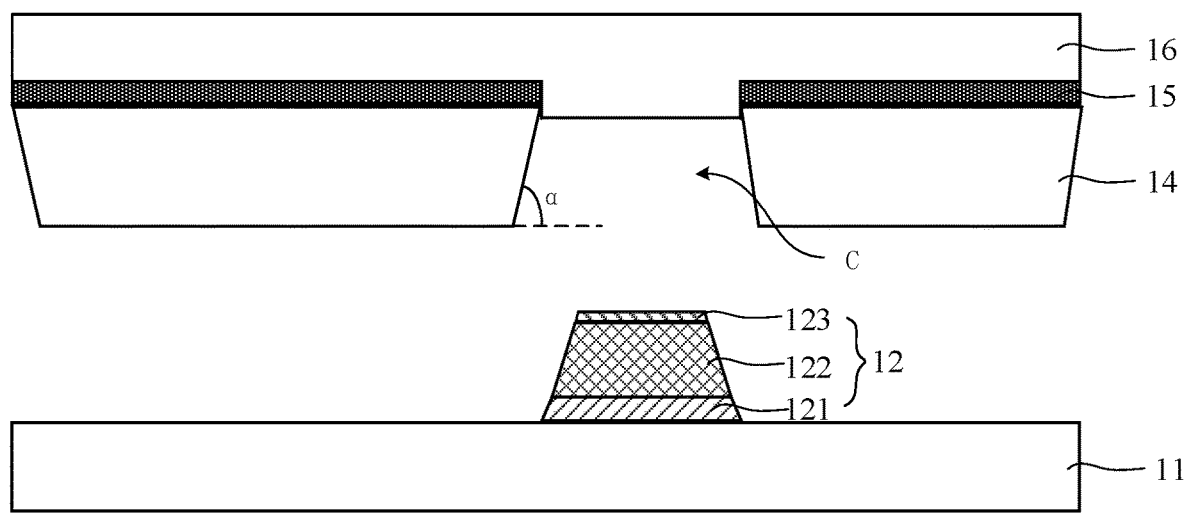
FIG. 12B is a partial cross-sectional view of a structure after main steps of the method for manufacturing the display substrate according to the exemplary embodiments of the present disclosure are performed.

FIG. 12B is a partial cross-sectional view of a structure after main steps of a method for manufacturing the display substrate according to some exemplary embodiments of the present disclosure are performed. Referring to FIG. 12B, the reinforcement layer 12 may have a regular trapezoidal shape in the cross-sectional view. For example, each of the first metal layer 121, the second metal layer 122 and the third metal layer 123 may have a regular trapezoidal shape in the cross-sectional view.

Accordingly, the recessed portion C may have a regular trapezoidal shape in the cross-sectional view. For example, at least one sidewall of the recessed portion C may have a slope angle α within a range of 40° to 80°, for example, within a range of 40° to 60°, for example, about 45° or about 50°.

According to the embodiments of the present disclosure, the display substrate manufactured by the method described above may not only ensure the electrical characteristics of the device, but also include the recessed portion C on the first base substrate, so that the light transmittance in the first region of the display substrate may be improved, which is advantageous to improve the quality of the image received by the image sensor.

Figure 13:
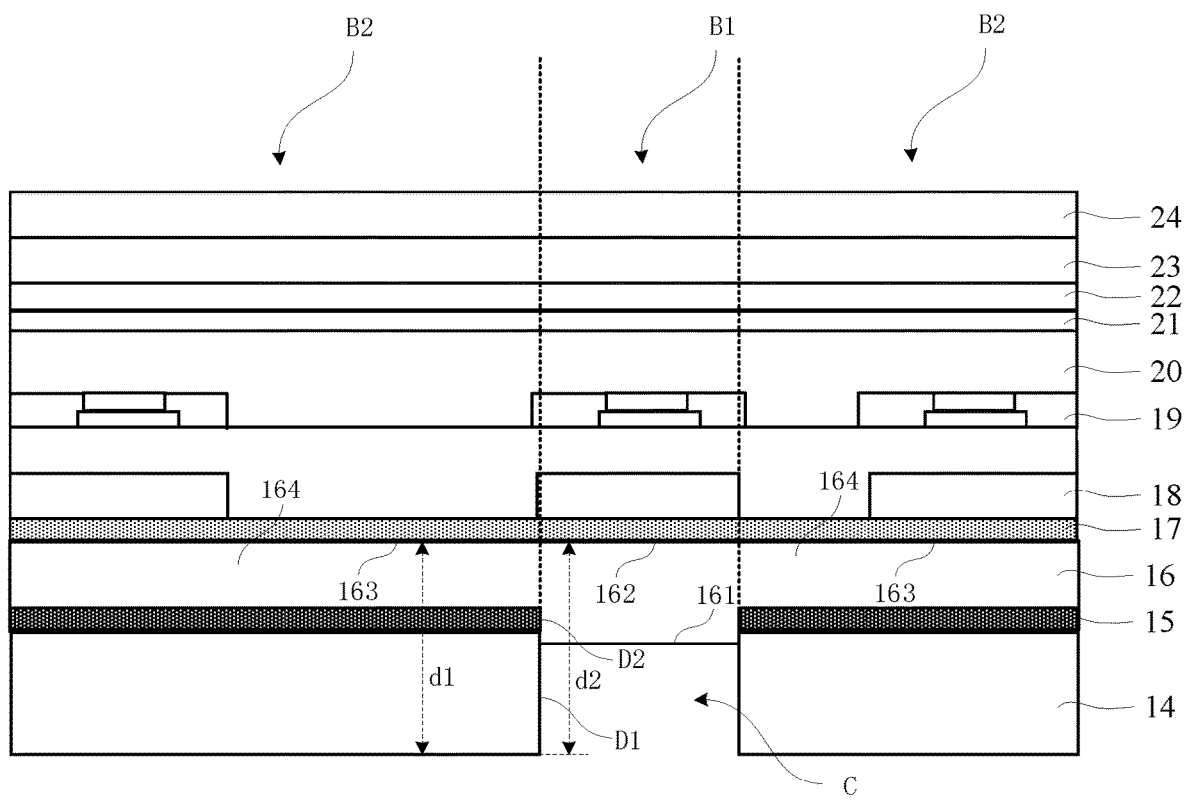
FIG. 13 is a cross-sectional view of a display substrate according to the exemplary embodiments of the present disclosure.

Another embodiment of the present disclosure provides a display substrate. As shown in FIG. 13, the display substrate includes a first display region B1 and a second display region B2. An orthographic projection direction of the first display area B1 is suitable for an installation of an image sensor, so that the image sensor may receive light and acquire image information from the first display region B1. The second display region B2 is a region for display which is different from the first display region B1, and the second display region B2 is not used for image acquisition.

According to the embodiments of the present disclosure, the display substrate may include a first base substrate 14, a second base substrate 16, a first barrier layer 15, and a light emitting unit 19. The second base substrate 16 is located on a side of the first base substrate 14. The first barrier layer 15 is arranged between the first base substrate 14 and the second base substrate 16. The light emitting unit 19 is arranged on a side of the second base substrate 16 away from the first base substrate 14.

For example, at least one light emitting unit 19, for example, a plurality of light emitting units 19, are provided in the first display region B1. A plurality of light emitting units 19 are provided in the second display region B2. A distribution density of the light emitting units in the first display region B1 is less than a distribution density of the light emitting units in the second display region B2. For example, the distribution density of the light emitting units in the first display region B1 may be 50~100/mm$^2$, and the distribution density of the light emitting units in the second display region B2 may be 80~500/mm$^2$.

According to the embodiments of the present disclosure, the first base substrate 14 is provided with a first through region D1 penetrating the first base substrate 14. An orthographic projection of the first through region D1 on the first base substrate 14 is located in an orthographic projection of the first display region on the first base substrate.

For example, the first through region D1 may be a circle, an ellipse, or a rectangle. In other alternative embodiments, the first through region D1 may also have other suitable shapes.

According to the embodiments of the present disclosure, the first barrier layer 15 includes a second through region D2 penetrating the first barrier layer 15. An orthographic projection of the second through region D2 on the first base substrate 14 coincides with the orthographic projections of the first through region D1 on the first base substrate.

For example, the second through region D2 may have the same shape as the first through region D1, such as a circle, an ellipse, or a rectangle. In other alternative embodiments, the second through region D2 may also have other suitable shapes same as the first through region D1.

According to the embodiments of the present disclosure, the second base substrate 16 includes a first substrate sub-portion 161 located in the first display region B1. The first substrate sub-portion 161 penetrates the second through region D2, and at least a part of the first substrate sub-portion 161 is located in the first through region D1. The display substrate includes a recessed portion C, and an orthographic projection of the recessed portion C on the first base substrate 14 coincides with the orthographic projection of the first through region D1 on the first base substrate 14.

According to the embodiments of the present disclosure, the second base substrate 16 is integrally formed with the first substrate sub-portion 161 located in the first display region B1. By providing at least a part of the first substrate sub-portion 161 in the first through region D1, an insufficient strength of the display substrate in the first display region B1 caused by the formation of the recessed portion C on the display substrate may be enhanced. By forming the recessed portion C on the display substrate, a light blocking to the first display region B1 by the first base substrate 14 and the second base substrate 16 may be reduced, so that a light transmittance of the display region may be improved.

According to the embodiments of the present disclosure, the second base substrate 16 includes a first surface 162 and a second surface 163 located on a side away from the first base substrate. The first surface 162 is located in the first display region, and the second surface 163 is located in the second display region. The first surface 162 and the second surface 163 are formed as a flat surface.

For example, a distance between the first surface 162 and a bottom of the first base substrate 14 is d1, and a distance between the second surface 163 and the bottom of the first base substrate is d2. The first surface 162 and the second surface 163 being formed as a flat surface indicates that a value of d1 is equal to a value of d2, that is, the first surface 162 and the second surface 163 are located in a same plane. According to the embodiments of the present disclosure, the first surface 162 and the second surface 163 being formed as a flat surface may ensure the electrical characteristics of a driving circuit of the display substrate.

It should be noted that here, the expression "flat surface" means that there are no obvious protrusion or depression on a surface combined by the first surface 162 and the second surface 163, and "no obvious protrusion or depression" here means that except for fluctuations caused by a manufacturing process, heights of the surface at various positions do not have a difference outside a process error range.

According to the embodiments of the present disclosure, by forming the recessed portion C on the first base substrate 14, an overall thickness of the first base substrate 14 and the second base substrate 16 may be reduced, so as to reduce the light blocking to the image sensor by the base substrate, and to increase the light transmittance of the imaging region (that is, the first display region).

In alternative embodiments of the present disclosure, the display substrate may include a second barrier layer 17. The second barrier layer 17 is arranged on a side of the second base substrate 16 away from the first base substrate 14, and is closer to the second base substrate 16 than the light emitting unit 19. The second barrier layer 17 is provided to increase a strength of the display substrate.

According to the embodiments of the present disclosure, at least one light emitting unit 19 is provided in the first display region B1. For example, providing the light emitting unit 19 in the first display region B1 may ensure a normal display of images or information in the first display region B1. The arrangement of the light emitting unit in the first display region B1 may inevitably result in a decrease in the light transmittance of the first display region B1. By forming the recessed portion C in the first display region B1, the light transmittance of the first display region B1 may be improved while ensuring the display effect of the first display region B1.

According to the embodiments of the present disclosure, the second base substrate 16 may include a second substrate sub-portion 164 located in the second display region. A thickness of the first substrate sub-portion 161 is greater than a thickness of the second substrate sub-portion 164. After the first base substrate 14 and the first barrier layer 15 in the first display region B1 are removed, the strength of the display substrate in the first display region B1 necessarily decreases. In order to compensate for the insufficient strength of the first display region B1, the thickness of the first substrate sub-portion 161 is set to be greater the thickness that of the second substrate sub-portion 164, which may increase the strength of the second base substrate 16 in the first display region B1 and compensate for the insufficient strength. In addition, the thickness of the substrate sub-portion 161 is less than a sum of the thickness of the first base substrate 14 and the thickness of the second base substrate 16, so that the light transmittance of the first display region B1 may be ensured while satisfying the strength.

According to the embodiments of the present disclosure, a depth of the recessed portion C is less than the thickness of the first base substrate 14, and a difference between the thickness of the first base substrate 14 and the depth of the recessed portion C is about 0.5 micron to 2 microns, for example, about 1 micron.

For example, the depth of the recessed portion C may be set to about 2 microns to 7 microns.

The first base substrate 14 and the second base substrate 16 may contain a material, for example, polyimide.

The thickness of the first base substrate 14 may be set to, for example, about 3 microns to 8 microns, and the thickness of the second base substrate 16 may be set to, for example, about 3 microns to 5 microns.

For example, the depth of the recessed portion C is about 75%~95%, for example, about 80%~95%, or about 80%~90%, or about 82%~85% of the thickness of the first base substrate 14. For example, the depth of the recessed portion C is about 83% of the thickness of the first base substrate 14.

For example, the thickness of the first base substrate 14 may be greater than the thickness of the second base substrate 16. For example, the thickness of the first base substrate 14 may be greater than each of the thickness of the first substrate sub-portion 161 and the thickness of the second substrate sub-portion 164. For example, the thickness of the first base substrate 14 may be greater than the thickness of the second base sub-portion 164 by about 2 microns to 5 microns, and the thickness of the first base substrate 14 may be greater than the thickness of the first base sub-portion 161 by about 1 micron to 4 microns.

For example, the thickness of the first substrate sub-portion 161 is greater than that the thickness of the second substrate sub-portion 164 by about 0.5 micron to 2 microns.

Figure 14:
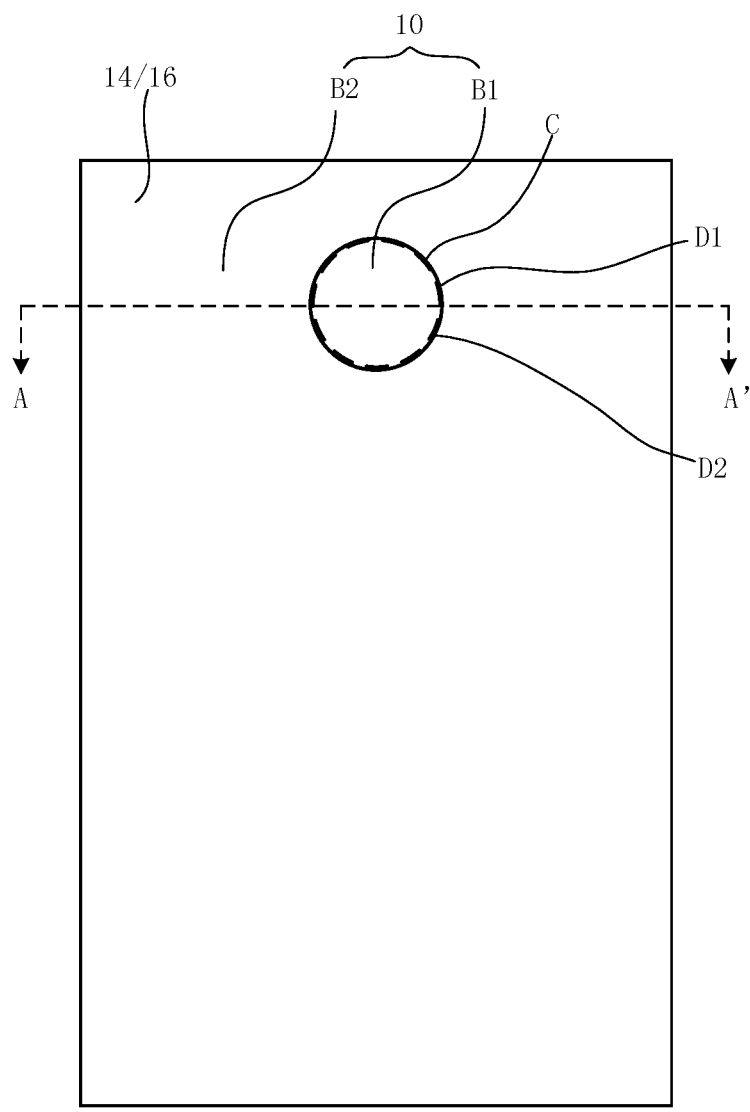
FIG. 14 is a schematic plan view of a display device according to the exemplary embodiments of the present disclosure, in which a plan view of a display substrate included in the display device is schematically shown.
Figure 15:
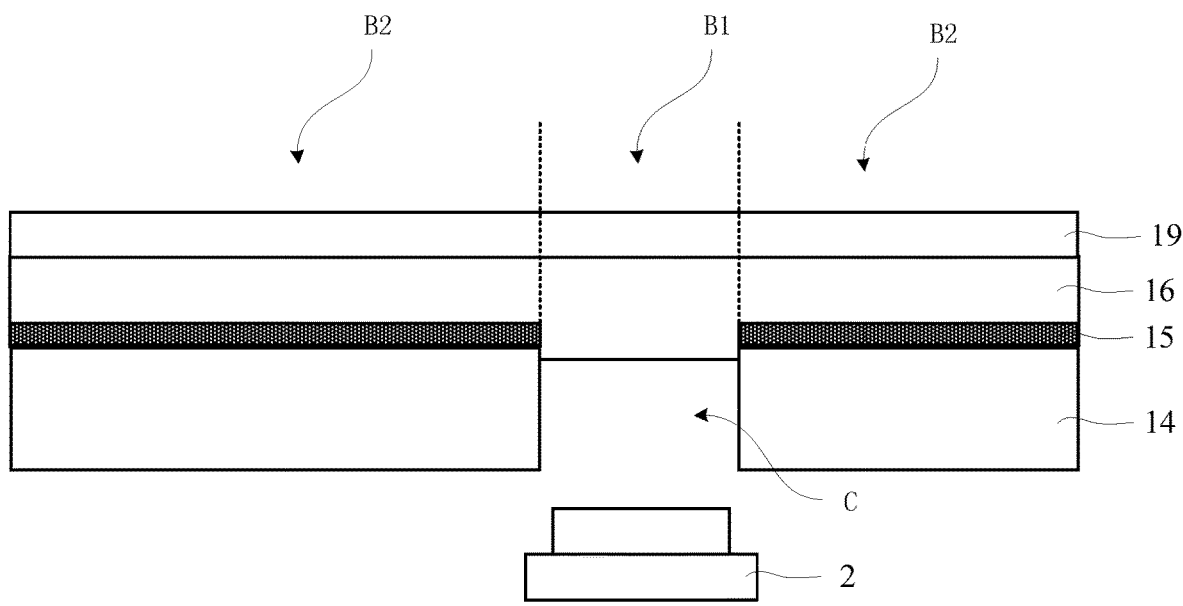
FIG. 15 is a schematic cross-sectional view of the display device according to some exemplary embodiments of the present disclosure taken along line AA' in FIG. 14.

FIG. 14 is a schematic plan view of a display device according to some exemplary embodiments of the present disclosure, in which a plan view of a display substrate included in the display device is schematically shown. FIG. 15 is a schematic cross-sectional view of the display device according to some exemplary embodiments of the present disclosure taken along line AA' in FIG. 14.

As shown in FIG. 14, the display device according to the embodiments of the present disclosure includes a display substrate 10. The display substrate 10 includes a display region that may include a first display region B1 and a second display region B2. For example, the first display region B1 and the second display region B2 do not overlap each other. For example, the second display region B2 at least partially surrounds (for example, completely surrounds) the first display region B1.

Referring to FIG. 14, an orthographic projection of a recessed portion C on the first base substrate 14 has an area substantially equal to an area of the first display region B1.

The area of the orthographic projection of the recessed portion C on the first base substrate 14 is about 0.1%~30% of an area of a combination of the first display region B1 and the second display region B2.

As shown in FIG. 15, the display substrate may include a first base substrate 14, a second base substrate 16, a first barrier layer 15, and a light emitting unit 19. A sensor 2 may be arranged on a side of a projection surface of the first base substrate 14 in the first display region B1 away from the second base substrate 16 and is located in a projection surface region where the recessed portion C is located (a lower side shown in FIG. 15, for example, a side opposite to a light emitting direction during display). The first display region B1 may meet imaging requirements of the sensor 2 for the light transmittance.

In the illustrated exemplary embodiment, the first display region B1 may have a shape of a circle, an ellipse or a rectangle, or may have other suitable shapes. The embodiments of the present disclosure are not limited thereto.

Referring back to FIG. 14 and FIG. 15, at least some embodiments of the present disclosure further provide a display device that may include the display substrate as described above and the sensor 2 (e.g., a camera).

The sensor 2 may have a structure known in the art, for example, including a complementary metal oxide semiconductor (CMOS) image sensor or a charge coupled device (CCD) image sensor. The sensor 2 may be electrically connected to an image processor. In addition to the image sensor, an imaging module including the image sensor may further include, for example, a lens assembly, in order to achieve a better imaging effect. The lens assembly and the image sensor may be arranged sequentially along an optical axis of the lens assembly in a direction perpendicular to the base substrate 14.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, an electronic clothing, an electronic bracelet, an electronic necklace, an electronic accessory, an electronic tattoo or a smart watch), a television, etc.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising a first display region and a second display region, wherein the display substrate comprises:
    a first base substrate;
    a second base substrate located on a side of the first base substrate;
    a first barrier layer between the first base substrate and the second base substrate; and
    a light emitting unit on a side of the second base substrate away from the first base substrate,
    wherein the first base substrate comprises a first through region penetrating the first base substrate, and an orthographic projection of the first through region on the first base substrate is located in an orthographic projection of the first display region on the first base substrate;
    wherein the first barrier layer comprises a second through region penetrating the first barrier layer, and an orthographic projection of the second through region on the first base substrate coincides with the orthographic projection of the first through region on the first base substrate;
    wherein the second base substrate comprises a first substrate sub-portion located in the first display region, the first substrate sub-portion penetrates the second through region, and at least a part of the first substrate sub-portion is located in the first through region, the display substrate comprises a recessed portion, and an orthographic projection of the recessed portion on the first base substrate coincides with the orthographic projection of the first through region on the first base substrate;
    wherein the second base substrate comprises a first surface and a second surface that are located on a side away from the first base substrate, the first surface is located in the first display region, the second surface is located in the second display region, and the first surface and the second surface are formed as a flat surface;
    wherein at least one light emitting unit is arranged in the first display region; and
    wherein a plurality of light emitting units are provided in the second display region, and a distribution density of the light emitting units in the first display region is less than a distribution density of the light emitting units in the second display region.

2. The display substrate of claim 1, wherein the second base substrate comprises a second substrate sub-portion located in the second display region, and a thickness of the first substrate sub-portion is greater than a thickness of the second substrate sub-portion by 0.5 micron to 2 microns.

3. The display substrate of claim 1, wherein a depth of the recessed portion is less than a thickness of the first base substrate by 0.5 micron to 2 microns.

4. The display substrate of claim 1, wherein the first base substrate and the second base substrate contain a material of polyimide.

5. The display substrate of claim 1, wherein a thickness of the first base substrate is 3 microns to 8 microns; or
    wherein a thickness of the second base substrate is 3 microns to 5 microns; or
    wherein the thickness of the first base substrate is greater than the thickness of the second base substrate by 1 micron to 5 microns.

6. The display substrate of claim 1, wherein a depth of the recessed portion is 75% to 95% of a thickness of the first base substrate; or
    wherein at least one sidewall of the recessed portion has a slope angle within a range of 40° to 80°.

7. The display substrate of claim 1, wherein an orthographic projection of the recessed portion on the first base substrate has an area substantially equal to an area of the first display region; or
    wherein the area of the orthographic projection of the recessed portion on the first base substrate is 0.1% to 30% of an area of a combination of the first display region and the second display region.

8. A display device comprising an image sensor and the display substrate of claim 1, wherein an orthographic projection of the image sensor on the first base substrate is located in the first display region.

9. A method for manufacturing a display substrate, comprising:
    forming a reinforcement layer in a first region of a glass back plate;
    forming a first substrate material layer on the glass back plate, wherein the first substrate material layer covers the reinforcement layer;
    forming a first barrier material layer on a side of the first substrate material layer away from the glass back plate;
    removing a part of the first barrier material layer and a part of the first substrate material layer that are located in the first region by a patterning process so as to form a first base substrate and a first barrier layer, and to expose a surface of the reinforcement layer away from the glass back plate;
    forming a second substrate material layer on a side of the first barrier layer away from the glass back plate so as to form a second base substrate, wherein a part of the second base substrate in the first region is in contact with the reinforcement layer, and a surface of the second base substrate away from the first base substrate is a flat surface; and
    separating both the glass back plate and the reinforcement layer from the first base substrate and the second base substrate so as to form a recessed portion in the first region, wherein a first adhesion force is formed between the reinforcement layer and the glass back plate, a second adhesion force is formed between the reinforcement layer and the second base substrate, and the first adhesion force is greater than the second adhesion force.

10. The method of claim 9, wherein the forming a reinforcement layer comprises:

forming a first metal layer in the first region of the glass back plate;

forming a retaining wall in a second region of the glass back plate, so that the retaining wall and the first metal layer form the recessed portion in the first region;

forming, in the first region, a second metal layer on a side of the first metal layer away from the glass back plate, so that the second metal layer fills the recessed portion; and removing the retaining wall.

11. The method of claim 10, wherein the forming a reinforcement layer further comprises:

forming a third metal layer on a side of the second metal layer away from the glass back plate.

12. The method of claim 10, wherein the first metal layer is formed by a magnetron sputtering process;

wherein the second metal layer is formed by an electroplating process; and wherein the first metal layer contains a material of copper.

13. The method of claim 11, wherein the third metal layer is formed by a patterning process;

wherein the first metal layer and the second metal layer contain a same material, and the third metal layer contains a material different from the material of the first metal layer.

14. The method of claim 13, wherein the third metal layer comprises a single-layer structure containing molybdenum; or wherein the third metal layer comprises a stacked-layer structure comprising a first sub-layer, a third sub-layer, and a second sub-layer sandwiched between the first sub-layer and the third sub-layer, the first sub-layer and the third sub-layer contain a same material, the first sub-layer contains molybdenum-niobium-titanium alloy or titanium, and the second sub-layer contains copper or aluminum.

15. The method of claim 9, wherein the removing a part of the first barrier material layer and a portion of the first substrate material layer that are located in the first region by a patterning process comprises:

removing the part of the first barrier material layer located in the first region by a patterning process, so as to form the first barrier layer; and removing the part of the first substrate material layer located in the first region by a patterning process by using the first barrier layer as a mask.

16. The method of claim 9, wherein the separating both the glass back plate and the reinforcement layer from the first base substrate and the second base substrate comprises:

separating both the glass back plate and the reinforcement layer from the first base substrate and the second base substrate by a laser peeling process.

17. The method of claim 11, wherein the first metal layer has a thickness of 0.2 micron to 0.6 microns; or the second metal layer has a thickness of 2.4 microns to 6.8 microns; or the third metal layer has a thickness of 1000 angstroms to 10000 angstroms.

18. The method of claim 10, wherein a thickness of the retaining wall is substantially equal to a thickness of the reinforcement layer; or wherein each of the thickness of the retaining wall and the thickness of the reinforcement layer is set to 2 microns to 7 microns.

* * * * *